United States Patent
Kojima et al.

(10) Patent No.: US 12,399,238 B2
(45) Date of Patent: *Aug. 26, 2025

(54) MAGNETIC SENSOR INCLUDING MAGNETIC DETECTION ELEMENT DISPOSED ON INCLINED SURFACE

(71) Applicant: TDK CORPORATION, Tokyo (JP)

(72) Inventors: Hidekazu Kojima, Tokyo (JP); Hiromichi Umehara, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/751,610

(22) Filed: Jun. 24, 2024

(65) Prior Publication Data
US 2024/0345188 A1 Oct. 17, 2024

Related U.S. Application Data

(63) Continuation of application No. 17/947,770, filed on Sep. 19, 2022, now Pat. No. 12,044,754.
(Continued)

(30) Foreign Application Priority Data

Sep. 1, 2022 (JP) ................. 2022-139173

(51) Int. Cl.
*G01R 33/09* (2006.01)
(52) U.S. Cl.
CPC ................. *G01R 33/093* (2013.01)
(58) Field of Classification Search
CPC ............ G01R 33/0029; G01R 33/0052; G01R 33/0094; G01R 33/0206; G01R 33/093; G01R 33/098; G01R 33/09; G01R 33/072; G01R 33/091; G01R 33/02; G01R 15/207; G01R 33/0005; G01R 33/0047; G01R 33/063; G01R 1/06733; G01R 33/4808; G01R 33/445; H01L 24/33; H01L 24/49; H01L 2224/73215; H01L 22/12;
(Continued)

(56) References Cited

U.S. PATENT DOCUMENTS

| | | |
|---|---|---|
| 5,227,761 A | 7/1993 | Sugimoto et al. |
| 7,687,284 B2 | 3/2010 | Naito et al. |

(Continued)

FOREIGN PATENT DOCUMENTS

| | | |
|---|---|---|
| JP | 2004-179250 A | 6/2004 |
| JP | 2004-319725 A | 11/2004 |
| JP | 2008-141210 A | 6/2008 |

OTHER PUBLICATIONS

Aug. 30, 2023 Notice of Allowance issued in U.S. Appl. No. 17/947,735.

*Primary Examiner* — Vinh P Nguyen
(74) *Attorney, Agent, or Firm* — Oliff PLC

(57) ABSTRACT

A magnetic sensor includes a substrate including a top surface, an insulating layer including an inclined surface, an MR element disposed on the inclined surface, a first insulating portion of an insulating material disposed on a part of the MR element, and a second insulating portion of an insulating material disposed on another part of the MR element at a position forward of the first insulating portion in a direction along the inclined surface, the direction being a direction away from the top surface of the substrate.

16 Claims, 10 Drawing Sheets

Related U.S. Application Data

(60) Provisional application No. 63/246,428, filed on Sep. 21, 2021.

(58) Field of Classification Search
CPC ................. H01L 25/0657; H01L 24/83; H01L 2224/16145; H01L 21/56; H01L 24/11; H01L 2224/73253; H01L 22/14; H01L 2224/83

See application file for complete search history.

(56) References Cited

U.S. PATENT DOCUMENTS

| | | |
|---|---|---|
| 8,178,361 B2 | 5/2012 | Naito et al. |
| 11,874,346 B2 * | 1/2024 | Kojima .............. G01R 33/0017 |
| 11,892,527 B2 * | 2/2024 | Kojima ................ G01R 33/098 |
| 11,897,728 B2 * | 2/2024 | Kattainen ............... B66B 5/185 |
| 12,000,910 B2 * | 6/2024 | Umehara ........... G01R 33/0047 |
| 12,044,754 B2 * | 7/2024 | Kojima ............. G01R 33/0206 |
| 12,061,247 B2 * | 8/2024 | Watanabe ............ G01R 33/093 |
| 12,188,996 B2 * | 1/2025 | Ota .................... G01R 33/0206 |
| 2006/0176142 A1 | 8/2006 | Naito et al. |
| 2007/0080381 A1 | 4/2007 | Chien et al. |
| 2008/0032423 A1 | 2/2008 | Wang et al. |
| 2009/0268349 A1 | 10/2009 | Makino et al. |
| 2009/0273863 A1 | 11/2009 | Kawano et al. |
| 2012/0272514 A1 | 11/2012 | Naito et al. |
| 2021/0302511 A1 | 9/2021 | Makino et al. |

* cited by examiner

MAGNETIC SENSOR INCLUDING MAGNETIC DETECTION ELEMENT DISPOSED ON INCLINED SURFACE

CROSS REFERENCE TO RELATED APPLICATIONS

This application is a continuation of U.S. application Ser. No. 17/947,770, filed on Sep. 19, 2022, which claims the benefit of U.S. Provisional Patent Application No. 63/246,428 filed on Sep. 21, 2021, and Japanese Priority Patent Application No. 2022-139173 filed on Sep. 1, 2022, the entire contents of each of which are incorporated herein by their reference.

BACKGROUND

The technology relates to a magnetic sensor including magnetoresistive elements each disposed on an inclined surface.

Magnetic sensors using magnetoresistive elements have been used for various applications in recent years. A system including a magnetic sensor may be intended to detect a magnetic field containing a component in a direction perpendicular to the surface of a substrate by using a magnetoresistive element provided on the substrate. In such a case, the magnetic field containing the component in the direction perpendicular to the surface of the substrate can be detected by providing a soft magnetic body for converting a magnetic field in the direction perpendicular to the surface of the substrate into a magnetic field in the direction parallel to the surface of the substrate or locating the magnetoresistive element on an inclined surface formed on the substrate.

As the magnetoresistive elements, spin-valve magnetoresistive elements are used, for example. The spin-valve magnetoresistive element includes a magnetization pinned layer having a magnetization whose direction is fixed, a free layer having a magnetization whose direction is variable depending on the direction of an applied magnetic field, and a gap layer disposed between the magnetization pinned layer and the free layer.

U.S. Patent Application Publication No. 2006/0176142 A1 discloses a magnetic sensor including magnetoresistive elements each formed on an inclined surface. Japanese Patent Application Laid-Open Publication No. 2008-141210 discloses a technique of forming two protective films of different materials on each side surface of a magnetoresistive element, thereby reducing a stress applied to the magnetoresistive element.

Typically, in a case where a magnetoresistive element is formed on an inclined surface as in the magnetic sensor disclosed in U.S. Patent Application Publication No. 2006/0176142 A1, side surfaces of the magnetoresistive element are tapered. Herein, regarding a case where a spin-valve magnetoresistive element is used as a magnetoresistive element, suppose a case where the characteristics of the magnetoresistive element are controlled using an insulating layer formed around the magnetoresistive element as in the technique disclosed in Japanese Patent Application Laid-Open Publication No. 2008-141210. A first layer located close to the inclined surface and a second layer located away from the inclined surface have different areas. Therefore, influence of the insulating layer on the first layer and influence of the insulating layer on the second layer are also different. Consequently, the magnetoresistive element may undesirably have characteristics different from the intended ones.

SUMMARY

A magnetic sensor according to one embodiment of the technology includes a substrate including a reference plane; a support member disposed on the substrate, the support member including at least one inclined surface inclined with respect to the reference plane; at least one magnetic detection element disposed on the at least one inclined surface; a first insulating portion of an insulating material disposed on a part of the at least one magnetic detection element; and a second insulating portion of an insulating material disposed on another part of the at least one magnetic detection element at a position forward of the first insulating portion in a direction along the at least one inclined surface, the direction being a direction away from the reference plane.

In the magnetic sensor according to one embodiment of the technology, the first insulating portion is disposed on a part of the magnetic detection element disposed on the inclined surface, and the second insulating portion is disposed on another part of the magnetic detection element. Thereby according to one embodiment of the technology, it is possible to achieve desired characteristics for a magnetic sensor including magnetoresistive elements each disposed on an inclined surface.

Other and further objects, features, and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
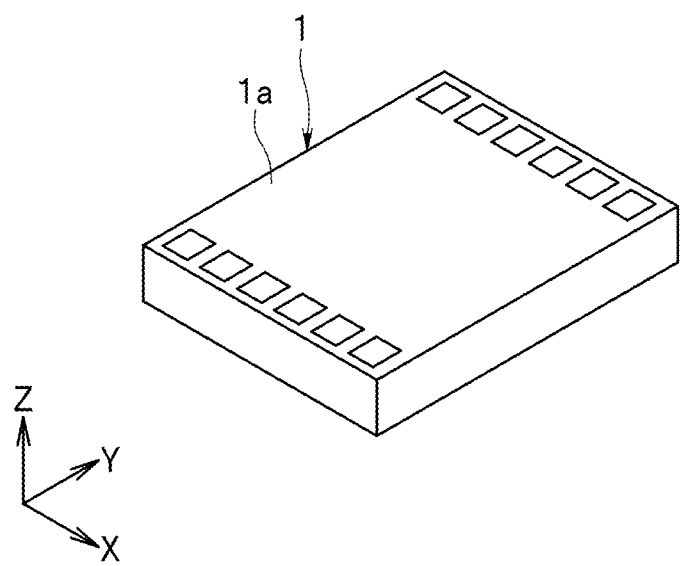
FIG. 1 is a perspective view showing a magnetic sensor according to a first example embodiment of the technology.

An object of the technology is to provide a magnetic sensor that includes magnetoresistive elements each disposed on an inclined surface and in which desired characteristics can be achieved.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Figure 2:
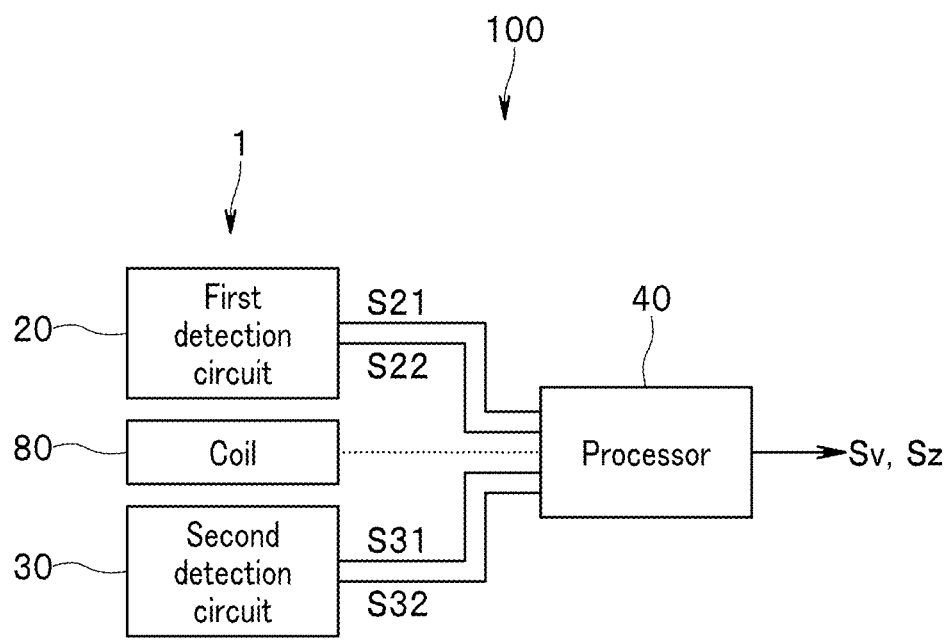
FIG. 2 is a functional block diagram showing a configuration of a magnetic sensor device including the magnetic sensor according to the first example embodiment of the technology.

First, a configuration of a magnetic sensor according to a first example embodiment of the technology will be described with reference to FIGS. 1 and 2. FIG. 1 is a perspective view showing a magnetic sensor according to the example embodiment. FIG. 2 is a functional block diagram showing a configuration of a magnetic sensor device including the magnetic sensor according to the example embodiment.

As shown in FIG. 1, the magnetic sensor 1 is in the form of a chip having a rectangular parallelepiped shape. The magnetic sensor 1 includes a top surface 1a and a bottom surface located opposite to each other and also includes four side surfaces connecting the top surface 1a to the bottom surface. The magnetic sensor 1 also includes a plurality of electrode pads disposed on the top surface 1a.

Now, a description will be given of a reference coordinate system in the present example embodiment with reference to FIG. 1. The reference coordinate system is an orthogonal coordinate system that is set with reference to a magnetic sensor 1 and defined by three axes. An X direction, a Y direction, and a Z direction are defined in the reference coordinate system. The X, Y, and Z directions are orthogonal to each other. In particular, in the example embodiment, a direction that is perpendicular to the top surface 1a of the magnetic sensor 1 and is oriented from the bottom surface to the top surface 1a of the magnetic sensor 1 is defined as the Z direction. The opposite directions to the X, Y, and Z directions will be expressed as −X, −Y, and −Z directions, respectively. The three axes defining the reference coordinate system are an axis parallel to the X direction, an axis parallel to the Y direction, and an axis parallel to the Z direction.

Hereinafter, the term "above" refers to positions located forward of a reference position in the Z direction, and "below" refers to positions opposite from the "above" positions with respect to the reference position. For each component of the magnetic sensor 1, the term "top surface" refers to a surface of the component located at the end thereof in the Z direction, and "bottom surface" refers to a surface of the component located at the end thereof in the −Z direction. The phrase "when seen in the Z direction" means that an object is seen from a position at a distance in the Z direction.

As shown in FIG. 2, the magnetic sensor 1 includes a first detection circuit 20 and a second detection circuit 30. Each of the first and second detection circuits 20 and 30 includes a plurality of magnetic detection elements, and is configured to detect a target magnetic field to generate at least one detection signal. In particular, in the example embodiment, the plurality of magnetic detection elements are a plurality of magnetoresistive elements. The magnetoresistive elements will hereinafter be referred to as MR elements.

A plurality of detection signals generated by the first and second detection circuits 20 and 30 are processed by a processor 40. The magnetic sensor 1 and the processor 40 constitute a magnetic sensor device 100. The processor 40 is configured to, by processing the plurality of detection signals generated by the first and second detection circuits 20 and 30, generate a first detection value and a second detection value respectively having correspondences with components of a magnetic field in two different directions at a predetermined reference position. In particular, in the present example embodiment, the foregoing two different directions are a direction parallel to an XY plane and a direction parallel to the Z direction. For example, the processor 40 is constructed of an application-specific integrated circuit (ASIC).

The processor 40 may be included in a support supporting the magnetic sensor 1, for example. The support includes a plurality of electrode pads. The first and second detection circuits 20 and 30 are connected to the processor 40 via the plurality of electrode pads of the magnetic sensor 1, the plurality of electrode pads of the support, and a plurality of bonding wires, for example. In a case where the plurality of electrode pads of the magnetic sensor 1 are provided on the top surface 1a of the magnetic sensor 1, the magnetic sensor 1 may be mounted on the top surface of the support in such a posture that the bottom surface of the magnetic sensor 1 faces the top surface of the support.

Figure 3:
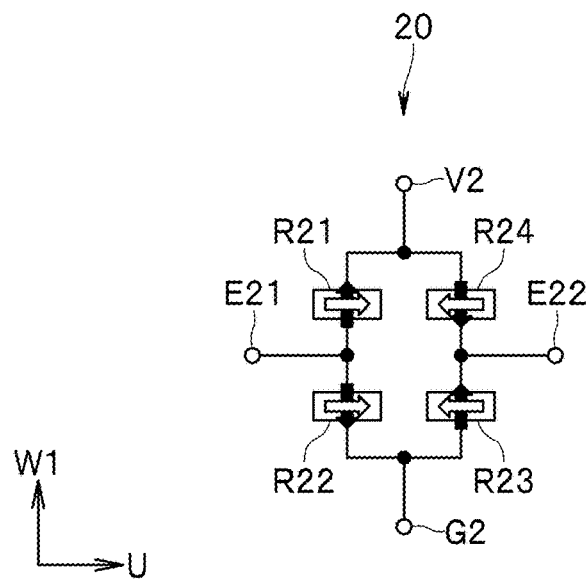
FIG. 3 is a circuit diagram showing a circuit configuration of a first detection circuit of the first example embodiment of the technology.
Figure 4:
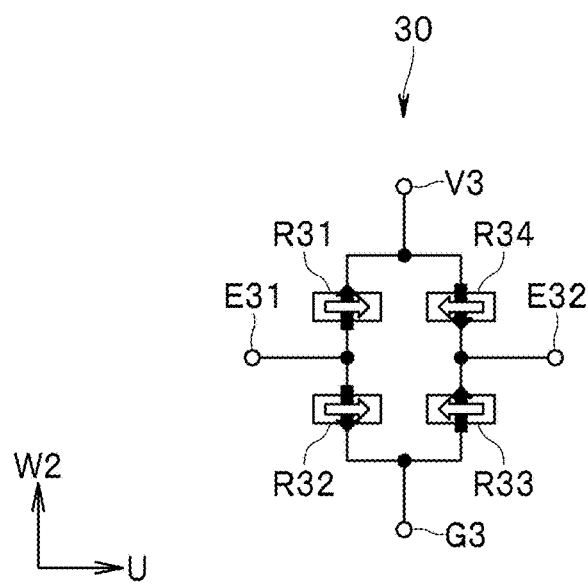
FIG. 4 is a circuit diagram showing a circuit configuration of a second detection circuit of the first example embodiment of the technology.
Figure 5:
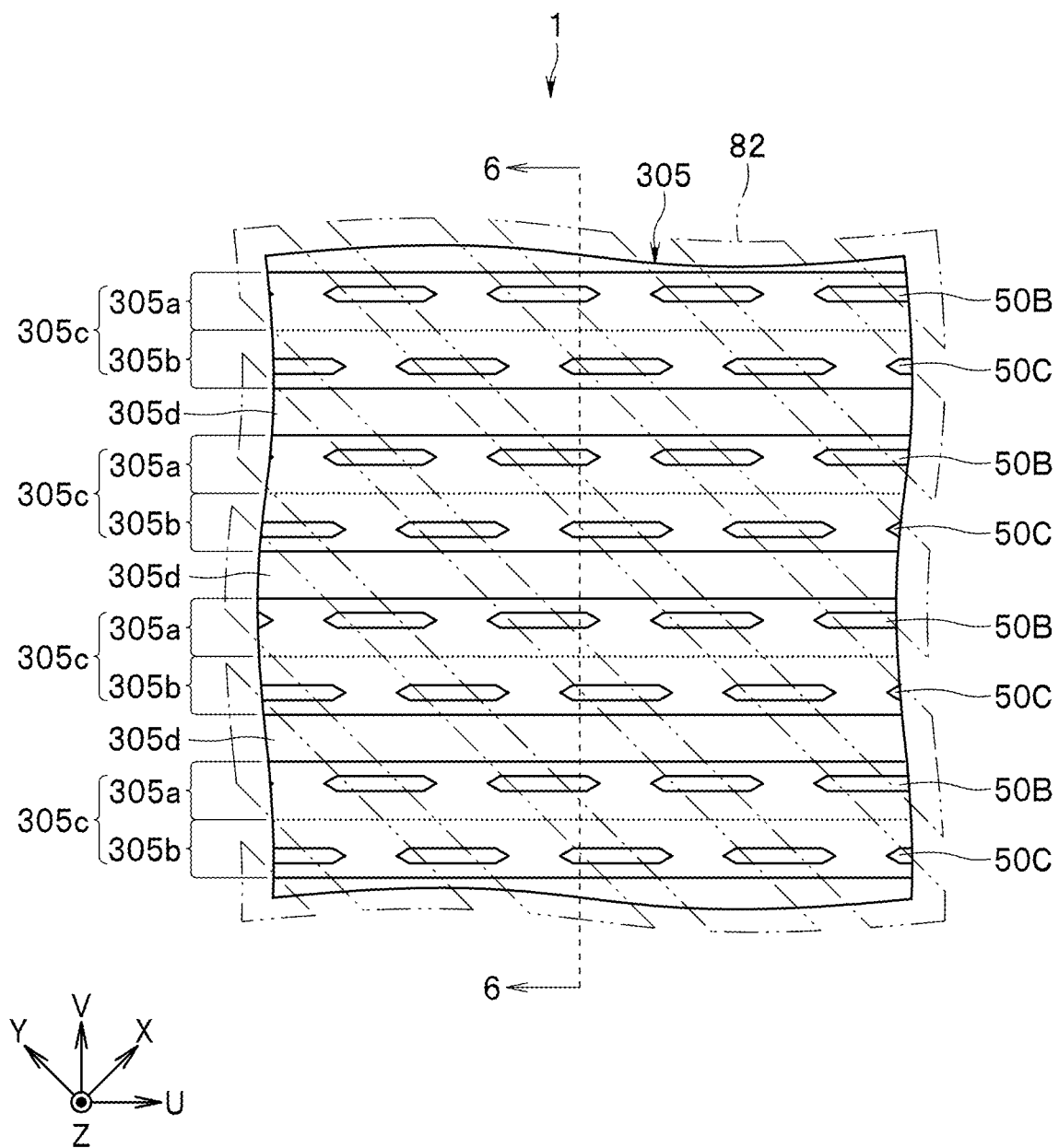
FIG. 5 is a plan view showing a part of the magnetic sensor according to the first example embodiment of the technology.
Figure 6:
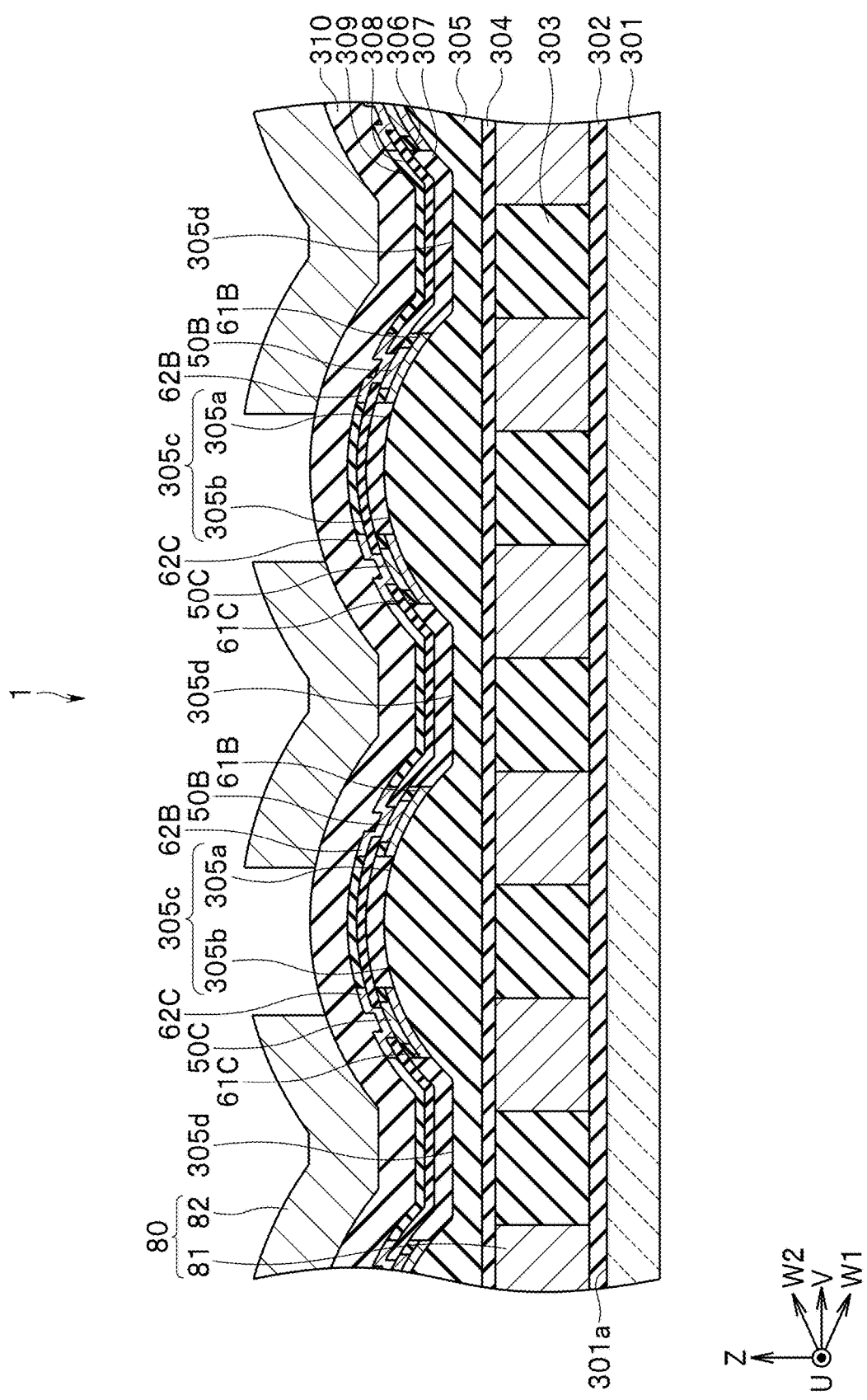
FIG. 6 is a sectional view showing a part of the magnetic sensor according to the first example embodiment of the technology.

Next, the first and second detection circuits 20 and 30 will be described with reference to FIGS. 3 to 6. FIG. 3 is a circuit diagram showing a circuit configuration of the first detection circuit 20. FIG. 4 is a circuit diagram showing a circuit configuration of the second detection circuit 30. FIG. 5 is a plan view showing a part of the magnetic sensor 1. FIG. 6 is a sectional view showing a part of the magnetic sensor 1.

Here, as shown in FIG. 5, a U direction and a V direction are defined as follows. The U direction is a direction rotated from the X direction to the −Y direction. The V direction is a direction rotated from the Y direction to the X direction. More specifically, in the present example embodiment, the U direction is set to a direction rotated from the X direction to the −Y direction by α, and the V direction is set to a direction rotated from the Y direction to the X direction by α. Note that α is an angle greater than 0° and smaller than 90°. For example, α is 45°. −U direction refers to a direction opposite to the U direction, and −V direction refers to a direction opposite to the V direction.

As shown in FIG. 6, a W1 direction and a W2 direction are defined as follows. The W1 direction is a direction rotated from the V direction to the −Z direction. The W2 direction is a direction rotated from the V direction to the Z direction. More specifically, in the present example embodiment, the W1 direction is set to a direction rotated from the V direction to the −Z direction by β, and the W2 direction is set to a direction rotated from the V direction to the Z direction by β. Note that β is an angle greater than 0° and smaller than 90°. −W1 direction refers to a direction opposite to the W1 direction, and −W2 direction refers to a direction opposite to the W2 direction. The W1 direction and W2 direction both are orthogonal to the U direction.

The first detection circuit 20 is configured to detect a component of the target magnetic field in a direction parallel to the W1 direction and generate at least one first detection signal which has a correspondence with the component. The second detection circuit 30 is configured to detect a component of the target magnetic field in a direction parallel to the W2 direction and generate at least one second detection signal which has a correspondence with the component.

As shown in FIG. 3, the first detection circuit 20 includes a power supply port V2, a ground port G2, signal output ports E21 and E22, a first resistor section R21, a second resistor section R22, a third resistor section R23, and a fourth resistor section R24. The plurality of MR elements of the first detection circuit 20 constitute the first to fourth resistor sections R21, R22, R23, and R24.

The first resistor section R21 is provided between the power supply port V2 and the signal output port E21. The second resistor section R22 is provided between the signal output port E21 and the ground port G2. The third resistor section R23 is provided between the signal output port E22 and the ground port G2. The fourth resistor section R24 is provided between the power supply port V2 and the signal output port E22.

As shown in FIG. 4, the second detection circuit 30 includes a power supply port V3, a ground port G3, signal output ports E31 and E32, a first resistor section R31, a second resistor section R32, a third resistor section R33, and a fourth resistor section R34. The plurality of MR elements of the second detection circuit 30 constitute the first to fourth resistor sections R31, R32, R33, and R34.

The first resistor section R31 is provided between the power supply port V3 and the signal output port E31. The second resistor section R32 is provided between the signal output port E31 and the ground port G3. The third resistor section R33 is provided between the signal output port E32 and the ground port G3. The fourth resistor section R34 is provided between the power supply port V3 and the signal output port E32.

A voltage or current of a predetermined magnitude is applied to each of the power supply ports V2 and V3. Each of the ground ports G2 and G3 is connected to the ground.

The plurality of MR elements of the first detection circuit 20 will be referred to as a plurality of first MR elements 50B. The plurality of MR elements of the second detection circuit 30 will be referred to as a plurality of second MR elements 50C. Since the first and second detection circuits 20 and 30 are the components of the magnetic sensor 1, it can be said that the magnetic sensor 1 includes the plurality of first MR elements 50B and the plurality of second MR elements 50C. Any given MR element will be denoted by the reference numeral 50.

Figure 7:
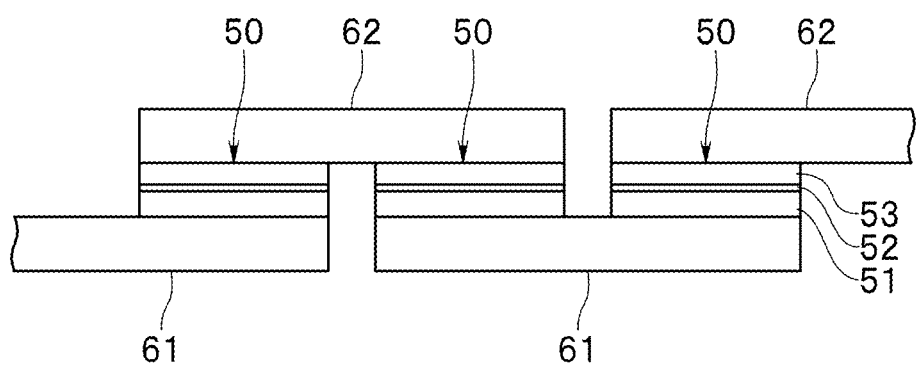
FIG. 7 is a side view showing a magnetoresistive element of the first example embodiment of the technology.

FIG. 7 is a side view showing the MR element 50. The MR element 50 is a spin-valve MR element including a plurality of magnetic layers. The MR element 50 includes a magnetization pinned layer 51 having a magnetization whose direction is fixed, a free layer 53 having a magnetization whose direction is variable depending on the direction of a target magnetic field, and a gap layer 52 located between the magnetization pinned layer 51 and the free layer 53. The MR element 50 may be a tunneling magnetoresistive (TMR) element or a giant magnetoresistive (GMR) element. In the TMR element, the gap layer 52 is a tunnel barrier layer. In the GMR element, the gap layer 52 is a nonmagnetic conductive layer. The resistance of the MR element 50 changes with the angle that the magnetization direction of the free layer 53 forms with respect to the magnetization direction of the magnetization pinned layer 51. The resistance of the MR element 50 is at its minimum value when the foregoing angle is 0°, and at its maximum value when the foregoing angle is 180°. In each MR element 50, the free layer 53 has a shape anisotropy that sets the direction of the magnetization easy axis to be orthogonal to the magnetization direction of the magnetization pinned layer 51. As a method for setting the magnetization easy axis in a predetermined direction in the free layer 53, a magnet configured to apply a bias magnetic field to the free layer 53 can be used. The magnetization pinned layer 51, the gap layer 52, and the free layer 53 are stacked in this order.

The MR element 50 may further include an antiferromagnetic layer disposed on the magnetization pinned layer 51 on the side opposite to the gap layer 52. The antiferromagnetic layer is formed of an antiferromagnetic material, and is in exchange coupling with the magnetization pinned layer 51 to thereby pin the magnetization direction of the magnetization pinned layer 51. Alternatively, the magnetization pinned layer 51 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled.

It should be appreciated that the layers 51 to 53 of each MR element 50 may be stacked in the reverse order to that shown in FIG. 7.

In FIGS. 3 and 4, solid arrows represent the magnetization directions of the magnetization pinned layers 51 of the MR elements 50. Hollow arrows represent the magnetization directions of the free layers 53 of the MR elements 50 in a case where no target magnetic field is applied to the MR elements 50.

In the example shown in FIG. 3, the magnetization directions of the magnetization pinned layers 51 in each of the first and third resistor sections R21 and R23 are the W1 direction. The magnetization directions of the magnetization pinned layers 51 in each of the second and fourth resistor sections R22 and R24 are the −W1 direction. The free layer 53 in each of the plurality of first MR elements 50B has a shape anisotropy that sets the direction of the magnetization easy axis to a direction parallel to the U direction. The magnetization directions of the free layers 53 in each of the first and second resistor sections R21 and R22 in a case where no target magnetic field is applied to the first MR elements 50B are the U direction. The magnetization directions of the free layers 53 in each of the third and fourth resistor sections R23 and R24 in the foregoing case are the −U direction.

In the example shown in FIG. 4, the magnetization directions of the magnetization pinned layers 51 in each of the first and third resistor sections R31 and R33 are the W2 direction. The magnetization directions of the magnetization pinned layers 51 in each of the second and fourth resistor sections R32 and R34 are the −W2 direction. The free layer 53 in each of the plurality of second MR elements 50C has a shape anisotropy that sets the direction of the magnetization easy axis to a direction parallel to the U direction. The magnetization directions of the free layers 53 in each of the first and second resistor sections R31 and R32 in a case where no target magnetic field is applied to the second MR elements 50C are the U direction. The magnetization directions of the free layers 53 in each of the third and fourth resistor sections R33 and R34 in the foregoing case are the −U direction.

The magnetic sensor 1 includes a magnetic field generator configured to apply a magnetic field in a predetermined direction to the free layer 53 of each of the plurality of first MR elements 50B, and the plurality of second MR elements 50C. In the present example embodiment, the magnetic field generator includes a coil 80 that applies a magnetic field in the predetermined direction to the free layer 53 in each of the plurality of first MR elements 50B and the plurality of second MR elements 50C.

Note that the magnetization directions of the magnetization pinned layers 51 and the directions of the magnetization easy axes of the free layers 53 may slightly deviate from the foregoing directions from the perspective of the accuracy of the manufacturing of the MR elements 50 and the like. The magnetization pinned layers 51 may be magnetized to include magnetization components in the foregoing directions as their main components. In such a case, the magnetization directions of the magnetization pinned layers 51 are the same or substantially the same as the foregoing directions.

In the present example embodiment, the MR element 50 is configured such that a current flows in the stacking direction of the plurality of magnetic layers, that is, the magnetization pinned layer 51 and the free layer 53. As described below, the magnetic sensor 1 includes a lower electrode and an upper electrode for flowing a current through the MR element 50. The MR element 50 is disposed between the lower electrode and the upper electrode.

Hereinafter, a specific structure of the magnetic sensor 1 will be described in detail with reference to FIGS. 5 and 6. FIG. 6 shows a part of a cross section at a position indicated by the line 6-6 in FIG. 5.

The magnetic sensor 1 includes a substrate 301 with a top surface 301a, insulating layers 302, 303, 304, 305, 306, 307, 308, 309, and 310, a plurality of lower electrodes 61B, a plurality of lower electrodes 61C, a plurality of upper electrodes 62B, a plurality of upper electrodes 62C, a plurality of lower coil elements 81, and a plurality of upper coil elements 82. It is assumed that the top surface 301a of the substrate 301 is parallel to the XY plane. The Z direction is also a direction perpendicular to the top surface 301a of the substrate 301. The coil elements are a part of the coil winding.

The insulating layer 302 is disposed on the substrate 301. The plurality of lower coil elements 81 are disposed on the insulating layer 302. The insulating layer 303 is disposed around the plurality of lower coil elements 81 on the insulating layer 302. The insulating layers 304 and 305 are stacked in this order on the plurality of lower coil elements 81 and the insulating layer 303.

The plurality of lower electrodes 61B and the plurality of lower electrodes 61C are disposed on the insulating layer 305. The plurality of first MR elements 50B are disposed on the plurality of lower electrodes 61B. The plurality of second MR elements 50C are disposed on the plurality of lower electrodes 61C. The insulating layer 306 is disposed on the plurality of lower electrodes 61B and the plurality of lower electrodes 61C and around the plurality of first MR elements 50B and around the plurality of second MR elements 50C. The insulating layer 307 is disposed on the insulating layer 305 and around the plurality of lower electrodes 61B, around the plurality of lower electrodes 61C, and around the insulating layer 306.

The insulating layer 308 is disposed on a part of each of the plurality of first MR elements 50B, on a part of each of the plurality of second MR elements 50C, and on the insulating layers 306 and 307. The plurality of upper electrodes 62B are disposed on another part of each of the plurality of first MR elements 50B and on a part of the insulating layer 308. The plurality of upper electrodes 62C are disposed on another part of each of the plurality of second MR elements 50C and on a part of the insulating layer 308. The insulating layer 309 is disposed on another part of the insulating layer 308 and around the plurality of upper electrodes 62B and around the plurality of upper electrodes 62C.

The insulating layer 310 is disposed on the plurality of upper electrodes 62B, the plurality of upper electrodes 62C, and the insulating layer 309. The plurality of upper coil elements 82 are disposed on the insulating layer 310. The magnetic sensor 1 may further include a not-shown insulating layer that covers the plurality of upper coil elements 82 and the insulating layer 310.

The magnetic sensor 1 includes a support member supporting the plurality of first MR elements 50B and the plurality of second MR elements 50C. The support member includes at least one inclined surface inclined with respect to the top surface 301a of the substrate 301. In particular, in the example embodiment, the support member includes the insulating layer 305. Note that FIG. 5 shows the insulating layer 305, the plurality of first MR elements 50B, the plurality of second MR elements 50C, and the plurality of upper coil elements 82 among the components of the magnetic sensor 1.

The insulating layer 305 includes a plurality of protruding surfaces 305c each protruding in a direction (the Z direction) away from the top surface 301a of the substrate 301. Each of the plurality of protruding surfaces 305c extends in a direction parallel to the U direction. The overall shape of each of the protruding surfaces 305c is a semi-cylindrical curved surface formed by moving the curved shape (arch shape) of the protruding surface 305c shown in FIG. 6 along the direction parallel to the U direction. The plurality of protruding surfaces 305c are arranged at predetermined intervals along a direction parallel to the V direction.

Each of the plurality of protruding surfaces 305c includes an upper end portion farthest from the top surface 301a of the substrate 301. In the example embodiment, each of the upper end portions of the plurality of protruding surfaces 305c extends in the direction parallel to the U direction. Herein, focus is placed on a given protruding surface 305c of the plurality of protruding surfaces 305c. The protruding surface 305c includes a first inclined surface 305a and a second inclined surface 305b. The first inclined surface 305a refers to the part of the protruding surface 305c on the side of the V direction of the upper end portion of the protruding surface 305c. The second inclined surface 305b refers to the part of the protruding surface 305c on the side of the −V direction of the upper end portion of the protruding surface 305c. In FIG. 5, a boundary between the first inclined surface 305a and the second inclined surface 305b is indicated by a dotted line.

The upper end portion of the protruding surface 305c may be the boundary between the first inclined surface 305a and the second inclined surface 305b. In such a case, the dotted line shown in FIG. 5 indicates the upper end portion of the protruding surface 305c.

The top surface 301a of the substrate 301 is parallel to the XY plane. Each of the first inclined surface 305a and the second inclined surface 305b is inclined with respect to the top surface 301a of the substrate 301, that is, the XY plane. In a cross section perpendicular to the top surface 301a of the substrate 301, a distance between the first inclined surface 305a and the second inclined surface 305b becomes smaller in a direction away from the top surface 301a of the substrate 301.

In the example embodiment, since two or more protruding surface 305c are present, the number of each of the first inclined surfaces 305a and the second inclined surfaces 305b is also two or more. The insulating layer 305 includes the plurality of first inclined surfaces 305a and the plurality of second inclined surfaces 305b.

The insulating layer 305 further includes a flat surface 305d present around the plurality of protruding surfaces 305c. The flat surface 305d is a surface parallel to the top surface 301a of the substrate 301. Each of the plurality of protruding surfaces 305c protrudes in the Z direction from the flat surface 305d. In the example embodiment, the plurality of protruding surfaces 305c are disposed at predetermined intervals. Thus, the flat surface 305d is present between the two protruding surfaces 305c adjoining in the V direction.

The insulating layer 305 includes a plurality of protruding portions each protruding in the Z direction, and a flat portion present around the plurality of protruding portions. Each of the plurality of protruding portions extends in the direction parallel to the U direction and includes the protruding surface 305c. The plurality of protruding portions are arranged at predetermined intervals in the direction parallel to the V direction. The thickness (the dimension in the Z direction) of the flat portion is substantially constant. The insulating layer 304 has a substantially constant thickness (i.e., a dimension in the Z direction), and is formed along the bottom surface of the insulating layer 305.

The plurality of lower electrodes 61B are disposed on the plurality of first inclined surfaces 305a. The plurality of lower electrodes 61C are disposed on the plurality of second inclined surfaces 305b. As described above, since each of the first inclined surfaces 305a and the second inclined surfaces 305b is inclined with respect to the top surface 301a of the substrate 301, that is, the XY plane, each of the top surfaces of the plurality of lower electrodes 61B and each of the top surfaces of the plurality of lower electrodes 61C are also inclined with respect to the XY plane. Thus, it can be said that the plurality of first MR elements 50B and the plurality of second MR elements 50C are disposed on the inclined surfaces inclined with respect to the XY plane. The insulating layer 305 is a member for supporting each of the plurality of first MR elements 50B and the plurality of second MR elements 50C so as to allow such MR elements to be inclined with respect to the XY plane.

Note that in the example embodiment, the first inclined surfaces 305a are curved surfaces. Therefore, the first MR elements 50B are curved along the curved surfaces (the first inclined surfaces 305a). For the sake of convenience, in the present example embodiment, the magnetization directions of the magnetization pinned layers 51 of the first MR elements 50B are defined as straight directions as described above. The W1 direction and the −W1 direction that are the magnetization directions of the magnetization pinned layers 51 of the first MR elements 50B are also directions in which the tangents to the first inclined surfaces 305a at the vicinity of the first MR elements 50B extend.

Similarly, in the example embodiment, the second inclined surfaces 305b are curved surfaces. Therefore, the second MR elements 50C are curved along the curved surfaces (the second inclined surfaces 305b). For the sake of convenience, in the present example embodiment, the magnetization directions of the magnetization pinned layers 51 of the second MR elements 50C are defined as straight directions as described above. The W2 direction and the −W2 direction that are the magnetization directions of the magnetization pinned layers 51 of the second MR elements 50C are also directions in which the tangents to the second inclined surfaces 305b at the vicinity of the second MR elements 50C extend.

As shown in FIG. 5, the plurality of first MR elements 50B are disposed so that two or more MR elements 50B are arranged both in the U direction and in the V direction. The plurality of first MR elements 50B are aligned in a row on one first inclined surface 305a. Similarly, the plurality of second MR elements 50C are disposed so that two or more MR elements 50C are arranged both in the U direction and in the V direction. The plurality of second MR elements 50C are aligned in a row on one second inclined surface 305b. In the example embodiment, the row of the plurality of first MR elements 50B and the row of the plurality of second MR elements 50C are alternately arranged in the direction parallel to the V direction.

Note that one first MR element 50B and one second MR element 50C adjoining each other may or may not deviate in the direction parallel to the U direction when seen in the Z direction. Two first MR elements 50B adjoining each other across one second MR element 50C may or may not deviate in the direction parallel to the U direction when seen in the Z direction. Two second MR elements 50C adjoining each other across one first MR element 50B may or may not deviate in the direction parallel to the U direction when seen in the Z direction.

The plurality of first MR elements 50B are connected in series by the plurality of lower electrodes 61B and the plurality of upper electrodes 62B. Herein, a method for connecting the plurality of first MR elements 50B will be described in detail with reference to FIG. 7. In FIG. 7, the reference sign 61 denotes a lower electrode corresponding to a given MR element 50, and the reference numeral 62 denotes an upper electrode corresponding to the given MR element 50. As shown in FIG. 7, each lower electrode 61 has a long slender shape. Two lower electrodes 61 adjoining in the longitudinal direction of the lower electrodes 61 have a gap therebetween. MR elements 50 are disposed near both longitudinal ends on the top surface of each lower electrode 61. Each upper electrode 62 has a long slender shape, and electrically connects two adjoining MR elements 50 that are disposed on two lower electrodes 61 adjoining in the longitudinal direction of the lower electrodes 61.

Although not shown, one MR element 50 located at the end of a row of a plurality of aligned MR elements 50 is connected to another MR element 50 located at the end of another row of a plurality of MR elements 50 adjoining in a direction intersecting with the longitudinal direction of the lower electrodes 61. Such two MR elements 50 are connected to each other by a not-shown electrode. The not-shown electrode may be an electrode that connects the bottom surfaces or the top surfaces of the two MR elements 50.

In a case where the MR elements 50 shown in FIG. 7 are the first MR elements 50B, the lower electrodes 61 shown in FIG. 7 correspond to the lower electrodes 61B, and the upper electrodes 62 shown in FIG. 7 correspond to the upper electrodes 62B. In such a case, the longitudinal direction of the lower electrodes 61 is parallel to the U direction.

Similarly, the plurality of second MR elements 50C are connected in series by the plurality of lower electrodes 61C and the plurality of upper electrodes 62C. The foregoing description of the method for connecting the plurality of first MR elements 50B holds true also for the method for connecting the plurality of second MR elements 50C. In a case where the MR elements 50 shown in FIG. 7 are the second MR elements 50C, the lower electrodes 61 shown in FIG. 7 correspond to the lower electrodes 61C, and the upper electrodes 62 shown in FIG. 7 correspond to the upper electrodes 62C. In such a case, the longitudinal direction of the lower electrodes 61 is parallel to the U direction.

Each of the plurality of upper coil elements 82 extends in a direction parallel to the Y direction. The plurality of upper coil elements 82 are arranged in the X direction. In particular, in the present example embodiment, when seen in the Z direction, each of the plurality of first MR elements 50B and the plurality of second MR elements 50C overlaps two upper coil elements 82.

Each of the plurality of lower coil elements 81 extends in a direction parallel to the Y direction. The plurality of lower coil elements 81 are arranged in the X direction. The shape and arrangement of the plurality of lower coil elements 81 may be the same as or different from those of the plurality of upper coil elements 82. In the example shown in FIGS. 5 and 6, the dimension in the X direction of each of the plurality of lower coil elements 81 is smaller than the dimension in the X direction of each of the plurality of upper coil elements 82. The distance between two lower coil elements 81 adjoining in the X direction is smaller than the distance between two upper coil elements 82 adjoining in the X direction.

In the example shown in FIGS. 5 and 6, the plurality of lower coil elements 81 and the plurality of upper coil elements 82 are electrically connected so as to constitute the coil 80 that applies a magnetic field in a direction parallel to the X direction to the free layer 53 in each of the plurality of first MR elements 50B and the plurality of second MR elements 50C. Alternatively, the coil 80 may be configured to be able to, for example, apply a magnetic field in the X direction to the free layers 53 in the first and second resistor sections R21 and R22 of the first detection circuit 20 and the first and second resistor sections R31 and R32 of the second detection circuit 30, and apply a magnetic field in the −X direction to the free layers 53 in the third and fourth resistor sections R23 and R24 of the first detection circuit 20 and the third and fourth resistor sections R33 and R34 of the second detection circuit 30. The coil 80 may be controlled by the processor 40.

Next, the first and second detection signals will be described. First, the first detection signal will be described with reference to FIG. 3. As the strength of the component of the target magnetic field in the direction parallel to the W1 direction changes, the resistance of each of the resistor sections R21 to R24 of the first detection circuit 20 changes either so that the resistances of the resistor sections R21 and R23 increase and the resistances of the resistor sections R22 and R24 decrease or so that the resistances of the resistor sections R21 and R23 decrease and the resistances of the resistor sections R22 and R24 increase. Thereby the electric potential of each of the signal output ports E21 and E22 changes. The first detection circuit 20 generates a signal corresponding to the electric potential of the signal output port E21 as a first detection signal S21, and generates a signal corresponding to the electric potential of the signal output port E22 as a first detection signal S22.

Next, the second detection signal will be described with reference to FIG. 4. As the strength of the component of the target magnetic field in the direction parallel to the W2 direction changes, the resistance of each of the resistor sections R31 to R34 of the second detection circuit 30 changes either so that the resistances of the resistor sections R31 and R33 increase and the resistances of the resistor sections R32 and R34 decrease or so that the resistances of the resistor sections R31 and R33 decrease and the resistances of the resistor sections R32 and R34 increase. Thereby the electric potential of each of the signal output ports E31 and E32 changes. The second detection circuit 30 generates a signal corresponding to the electric potential of the signal output port E31 as a second detection signal S31, and generates a signal corresponding to the electric potential of the signal output port E32 as a second detection signal S32.

Next, the operation of the processor 40 will be described. The processor 40 is configured to generate the first detection value and the second detection value based on the first detection signals S21 and S22 and the second detection signals S31 and S32. The first detection value is a detection value corresponding to the component of the target magnetic field in the direction parallel to the V direction. The second detection value is a detection value corresponding to the component of the target magnetic field in the direction parallel to the Z direction. The first detection value is represented by a symbol Sv, and the second detection value is represented by a symbol Sz.

The processor 40 generates the first and second detection values Sv and Sz as follows, for example. First, the processor 40 generates a value S1 by an arithmetic including obtainment of the difference S21−S22 between the first detection signal S21 and the first detection signal S22, and generates a value S2 by an arithmetic including obtainment of the difference S31−S32 between the second detection signal S31 and the second detection signal S32. Next, the processor 40 calculates values S3 and S4 using the following expressions (1) and (2).

$$S3=(S2+S1)/(2\cos\alpha) \quad (1)$$

$$S4=(S2-S1)/(2\sin\alpha) \quad (2)$$

The first detection value Sv may be the value S3 itself, or may be a result of a predetermined correction, such as a gain adjustment or an offset adjustment, made to the value S3. In the same manner, the second detection value Sz may be the value S4 itself, or may be a result of a predetermined correction, such as a gain adjustment or an offset adjustment, made to the value S4.

Figure 8:
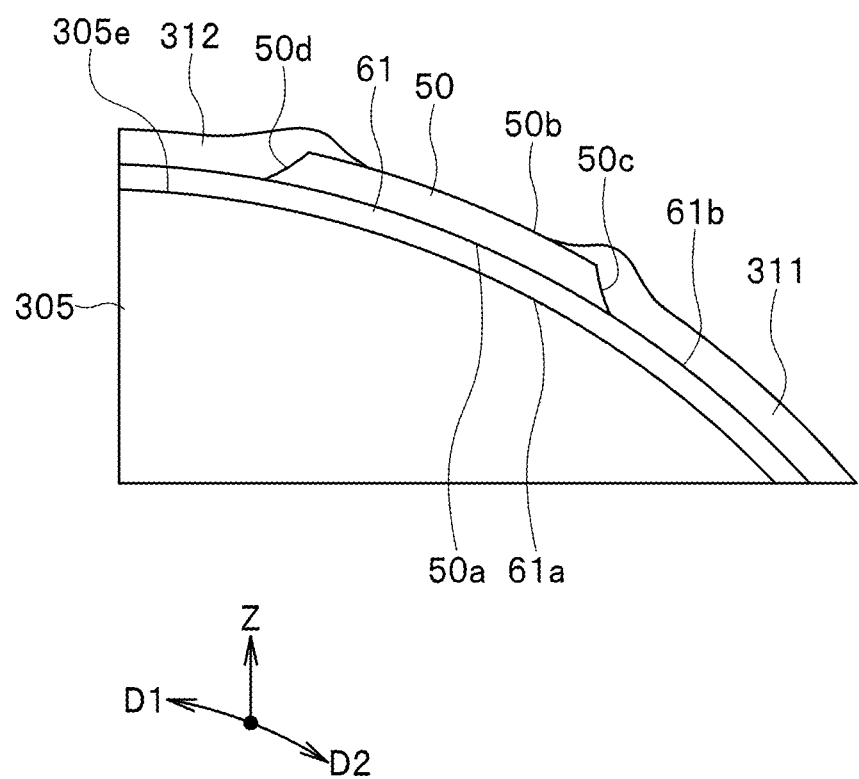
FIG. 8 is a sectional view showing first and second insulating portions of a first example of the first example embodiment of the technology.

Next, features of the structure of the magnetic sensor 1 according to the example embodiment will be described. First, a first example will be described. FIG. 8 is a sectional view showing first and second insulating portions of the first example.

FIG. 8 shows a cross section crossing the MR element 50 disposed on a given inclined surface 305e and parallel to a VZ plane. Hereinafter, a cross section parallel to the VZ plane will be referred to as a VZ cross section. The VZ cross section shown in FIG. 8 may be the one in which a cross section of the MR element 50 is seen from a position on the side of the U direction as in FIG. 6. In such a case, the MR element 50, the lower electrode 61, and the inclined surface 305e respectively correspond to the first MR element 50B, the lower electrode 61B, and the first inclined surface 305a. Alternatively, the VZ cross section shown in FIG. 8 may be the one in which a cross section of the MR element 50 is seen from a position on the side of the −U direction. In such a case, the MR element 50, the lower electrode 61, and the inclined surface 305e respectively correspond to the second MR element 50C, the lower electrode 61C, and the second inclined surface 305b.

Figure 9:
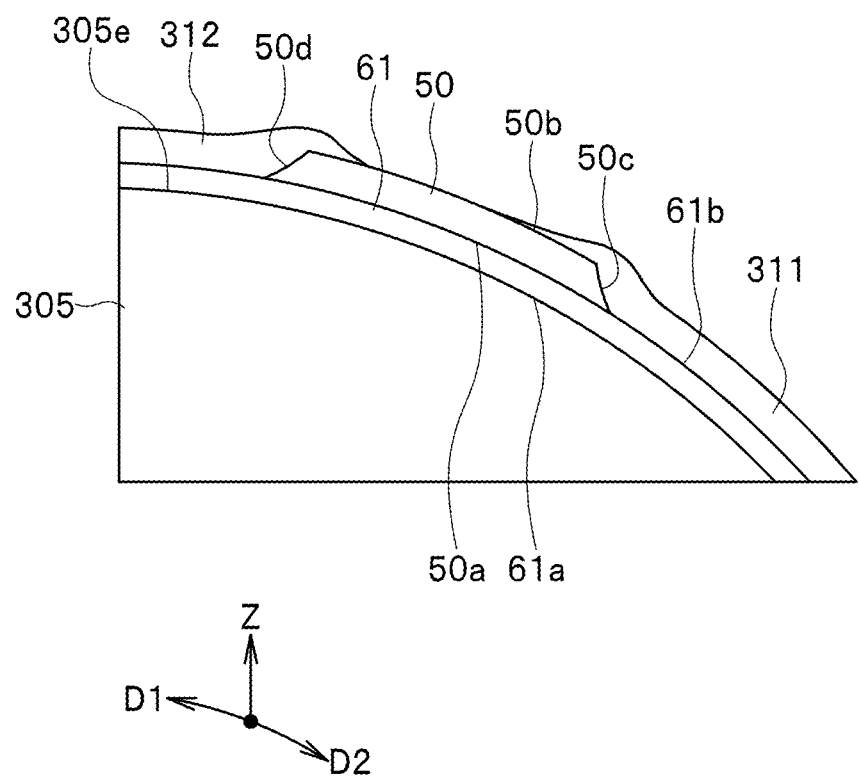
FIG. 9 is a sectional view showing first and second insulating portions of a second example of the first example embodiment of the technology.

Herein, as shown in FIGS. 8 and 9, a first direction D1 and a second direction D2 parallel to the VZ plane are defined. The first direction D1 is a direction lying along the inclined surface 305e and is also a direction away from a reference plane. In the present example embodiment, it is assumed that the top surface 301a of the substrate 301 (see FIG. 6) is the reference plane. The Z direction is one direction perpendicular to the reference plane (the top surface 301a of the substrate 301). The second direction D2 is a direction lying along the inclined surface 305e and is also a direction closer to the reference plane (the top surface 301a of the substrate 301).

In the following description, a direction that lies along the inclined surface 305e and is parallel to the first direction D1 (a direction parallel to the second direction D2) will be simply referred to as a direction along the inclined surface 305e. Such a direction is also a direction that lies along the inclined surface 305e and in which a distance from the reference plane (the top surface 301a of the substrate 301) changes.

The MR element 50 includes a bottom surface 50a facing the inclined surface 305e, a top surface 50b on the side opposite to the bottom surface 50a, a first side surface 50c, and a second side surface 50d. The first side surface 50c connects an end portion of the bottom surface 50a on the side of the second direction D2 and an end portion of the top surface 50b on the side of the second direction D2. The second side surface 50d is disposed forward of the first side surface 50c in the first direction D1. The second side surface 50d connects an end portion of the bottom surface 50a on the side of the first direction D1 and an end portion of the top surface 50b on the side of the first direction D1.

The lower electrode 61 is provided between the MR element 50 and the inclined surface 305e. The lower electrode 61 includes a bottom surface 61a facing the inclined surface 305e, a top surface 61b on a side opposite to the bottom surface 61a, and two side surfaces (see FIG. 6) each connecting the bottom surface 61a and the top surface 61b. Note that the lower electrode 61 may be formed on a region from the inclined surface 305e to the flat surface 305d. In such a case, one of the two side surfaces of the lower electrode 61 is disposed on the inclined surface 305e and the other is disposed on the flat surface 305d. Alternatively, the entire lower electrode 61 may be disposed on the inclined surface 305e. In such a case, both the two side surfaces of the lower electrode 61 are disposed on the inclined surface 305e.

The magnetic sensor 1 includes a first insulating portion 311 and a second insulating portion 312. Each of the first and second insulating portions 311 and 312 may include a single insulating layer or a plurality of insulating layers. In particular, in the present example embodiment, each of the first and second insulating portions 311 and 312 includes the insulating layers 306 and 308 shown in FIG. 6. Note that each of the insulating layers 306 and 308 may also include a single insulating film or a plurality of insulating films.

Since each of the insulating layers 306 and 308 is formed of an insulating material, each of the first and second insulating portions 311 and 312 is also formed of an insulating material. $Al_2O_3$ or $SiO_2$, for example, is used as an insulating material for forming each of the first and second insulating portions 311 and 312 (each of the insulating layers 306 and 308).

The first insulating portion 311 is disposed on a part of the MR element 50. In particular, in the present example embodiment, the first insulating portion 311 is disposed on the first side surface 50c of the MR element 50 and on a part of the top surface 50b of the MR element 50.

The second insulating portion 312 is disposed on another part of the MR element 50 at a position forward of the first insulating portion 311 in the first direction D1. In particular, in the present example embodiment, the second insulating portion 312 is disposed on the second side surface 50d of the MR element 50 and on another part of the top surface 50b of the MR element 50.

The upper electrode 62 (see FIG. 7) is disposed on the MR element 50, the first insulating portion 311, and the second insulating portion 312, and is electrically connected to the MR element 50. A part of each of the first and second insulating portions 311 and 312 is provided between the MR element 50 and the upper electrode 62. Another part of each of the first and second insulating portions 311 and 312 is provided between the lower electrode 61 and the upper electrode 62.

The description has been made heretofore of the structural features of the magnetic sensor 1 focusing on a single inclined surface 305e (a single first inclined surface 305a or a single second inclined surface 305b). In the present example embodiment, there are a plurality of first inclined surfaces 305a and a plurality of second inclined surfaces 305b. The foregoing description of the single inclined surface 305e holds true also for each of the plurality of first inclined surfaces 305a and the plurality of second inclined surfaces 305b.

Now, focus attention on a single first inclined surface 305a and a single second inclined surface 305b included in a single projecting surface 305c, a single first MR element 50B disposed on the single first inclined surface 305a, and a single second MR element 50C disposed on the single second inclined surface 305b (see FIG. 6). The second insulating portion 312 disposed on a part of the first MR element 50B and the second insulating portion 312 disposed on a part of the second MR element 50C may be a single continuous undivided insulating portion. In particular, in the present example embodiment, a part, which is continuous, of the insulating layer 308 is formed above a region from the first inclined surface 305a to the second inclined surface 305b.

Next, focus attention on the two projecting surfaces 305c adjoining in the direction parallel to the V direction, the first inclined surface 305a included in the projecting surface 305c on the side of the −V direction, the second inclined surface 305b included in the projecting surface 305c on the side of the V direction, the single first MR element 50B disposed on the single first inclined surface 305a, and the single second MR element 50C disposed on the single second inclined surface 305b (see FIG. 6). The first insulating portion 311 disposed on a part of the first MR element 50B and the first insulating portion 311 disposed on a part of the second MR element 50C may be a single continuous undivided insulating portion. In particular, in the present example embodiment, a part, which is continuous, of the insulating layer 308 is formed above a region from the first inclined surface 305a to the second inclined surface 305b.

Though not shown, the first insulating portion 311 and the second insulating portion 312 may also be a single continuous undivided insulating portion. In particular, in the present example embodiment, the insulating layer 308 may be formed above the plurality of first inclined surfaces 305a and the plurality of second inclined surfaces 305b without being divided. The insulating layer 306 may be formed around the first MR element 50B without being divided above each of the plurality of first inclined surfaces 305a. Similarly, the insulating layer 306 may be formed around the second MR element 50C without being divided above each of the plurality of second inclined surfaces 305b.

Next, a second example will be described. FIG. 9 is a sectional view showing the first and second insulating portions 311 and 312 of the second example. In the second example, the area of the top surface 50b of the MR element 50 covered with the first insulating portion 311 is larger than the area of the top surface 50b of the MR element 50 covered with the second insulating portion 312.

Figure 10:
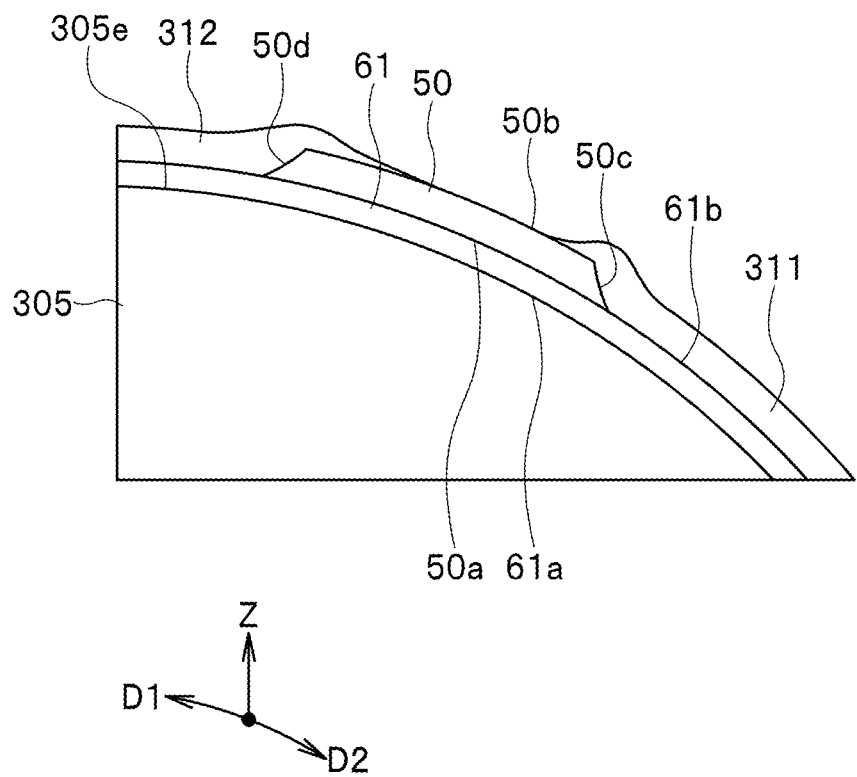
FIG. 10 is a sectional view showing first and second insulating portions of a third example of the first example embodiment of the technology.

Next, a third example will be described. FIG. 10 is a sectional view showing the first and second insulating portions 311 and 312 of the third example. In the third example, the area of the top surface 50b of the MR element 50 covered with the second insulating portion 312 is larger than the area of the top surface 50b of the MR element 50 covered with the first insulating portion 311.

Figure 11:
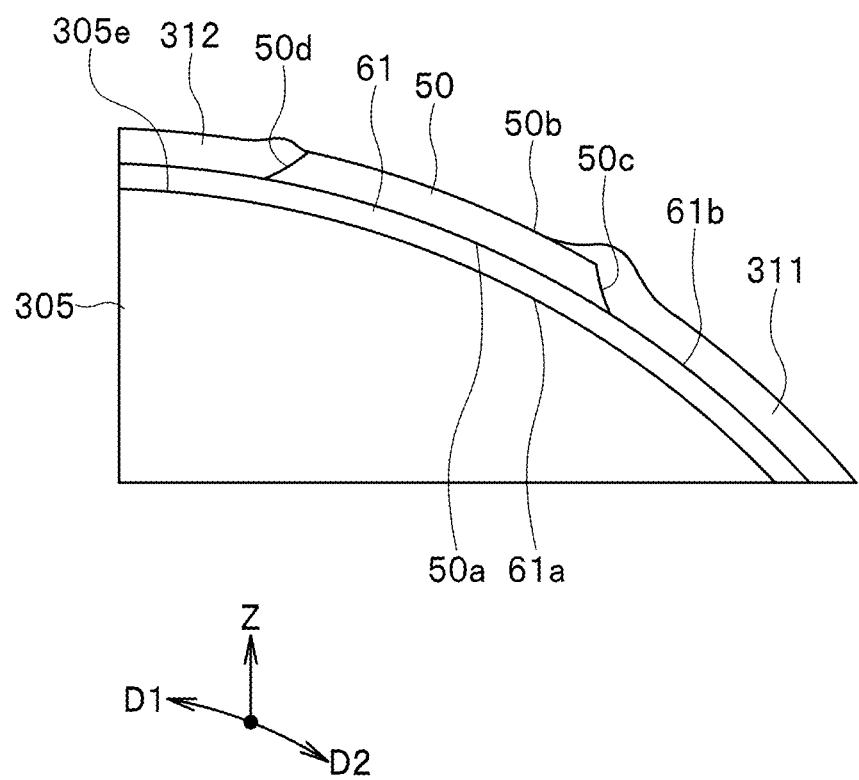
FIG. 11 is a sectional view showing first and second insulating portions of a fourth example of the first example embodiment of the technology.

Next, a fourth example will be described. FIG. 11 is a sectional view showing the first and second insulating portions 311 and 312 of the fourth example. In the fourth example, the second insulating portion 312 covers the second side surface 50d of the MR element 50, but does not cover the top surface 50b of the MR element 50.

Next, operations and effects of the magnetic sensor 1 according to the example embodiment will be described. In the present example embodiment, the insulating layers 306 and 308 are disposed around each MR element 50. Each of the first and second insulating portions 311 and 312 includes the insulating layers 306 and 308. The insulating portions (insulating layers) disposed around each MR element 50 are known to influence the characteristics of the MR element 50. In the present example embodiment, the first insulating portion 311 is disposed on a part of the MR element 50, and the second insulating portion 312 is disposed on another part of the MR element 50. Thereby, according to the present example embodiment, desired characteristics can be achieved.

Hereinafter, the sensitivity of the MR element 50 will be described as an example of the characteristics of the MR element 50. The free layer 53 has a shape anisotropy that sets the direction of the magnetization easy axis to be parallel to the U direction. In a case where a target magnetic field is not applied to the MR element 50, the magnetization direction of the free layer 53 is the U direction or the -U direction. In the MR element 50 with such a configuration, if the anisotropy of the free layer 53 in a direction orthogonal to the U direction is increased, the magnetization direction of the free layer 53 becomes more likely to change, with the result that the sensitivity of the MR element 50 improves.

For example, it is possible to increase the anisotropy of the free layer 53 in the direction orthogonal to the U direction by forming the free layer 53 using a negative magnetostrictive layer and forming the first and second insulating portions 311 and 312 using an insulating layer that applies a compressive stress to the free layer 53. In particular, in the present example embodiment, the first insulating portion 311 is disposed on a part of the MR element 50, and the second insulating portion 312 is disposed on another part of the MR element 50. In particular, in the present example embodiment, at least one of the first insulating portion 311 or the second insulating portion 312 is disposed on the top surface 50b of the MR element 50. Thereby, according to the present example embodiment, the anisotropy of the free layer 53 in the direction orthogonal to the U direction can be increased than a case where the first and second insulating portions 311 and 312 are not disposed on a part of the MR element 50, and thus, the sensitivity of the MR element 50 can be improved.

By the way, the MR element 50 is formed on the inclined surface 305e. Each of the first and second side surfaces 50c and 50d is tapered due to restrictions on the production process of forming the MR element 50. Therefore, the area of the free layer 53 located at a position away from the inclined surface 305e becomes small, and the outer peripheral length of the free layer 53 also becomes short. In a case where the first and second insulating portions 311 and 312 are not disposed on a part of the MR element 50, it may be impossible to apply a sufficiently high compressive stress to the free layer 53. In contrast, in the present example embodiment, the first and second insulating portions 311 and 312 are disposed on a part of the MR element 50 as described above. Thereby, according to the present example embodiment, a sufficiently high compressive stress can be applied to the free layer 53.

Note that the magnitude of the compressive stress applied to the free layer 53 can be controlled by controlling the amounts of the first and second insulating portions 311 and 312 disposed on each MR element 50 or adjusting the configuration of each of the first and second insulating portions 311 and 312. For example, in a case where each of the first and second insulating portions 311 and 312 has a three-layer structure of $Al_2O_3/SiO_2/Al_2O_3$, the magnitude of the compressive stress can be adjusted by changing the proportion of the thickness of each layer.

When the compressive stress applied to the free layer 53 is increased, the sensitivity hysteresis of the MR element 50 may increase. The sensitivity hysteresis of the MR element 50 can be adjusted by controlling the magnitude of the compressive stress applied to the free layer 53 as described above.

Note that the description has been made heretofore of an example case where the free layer 53 is disposed at a position farther from the inclined surface 305e than a position where the magnetization pinned layer 51 is disposed as shown in FIG. 7. However, the configuration of the MR element 50 is not limited to the example shown in FIG. 7, and the magnetization pinned layer 51 may be disposed at a position farther from the inclined surface 305e than a position where the free layer 53 is disposed. In such a case, the material of each of the magnetization pinned layer 51, the first insulating portion 311, and the second insulating portion 312 may be selected so that the magnetization direction of the magnetization pinned layer 51 becomes less likely to change. In such a case, it is possible to more easily suppress changes in the magnetization direction of the magnetization pinned layer 51 by disposing the first and second insulating portions 311 and 312 on a part of the MR element 50 than a case where the first and second insulating portions 311 and 312 are not disposed on a part of the MR element 50.

Second Example Embodiment

Figure 12:
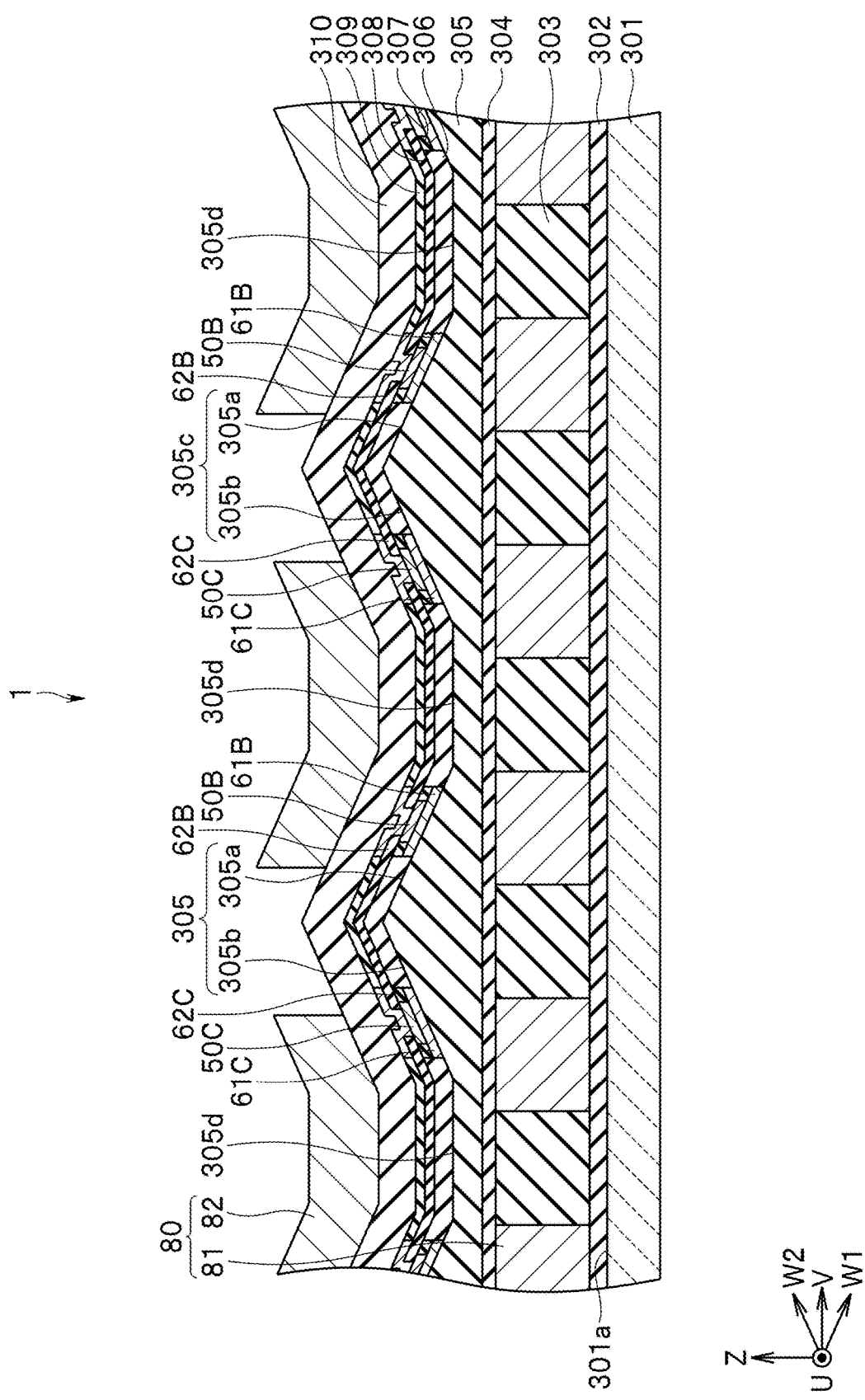
FIG. 12 is a sectional view showing a part of the magnetic sensor according to the second example embodiment of the technology.

A magnetic sensor according to a second example embodiment of the technology will now be described with reference to FIG. 12. FIG. 12 is a sectional view showing a part of the magnetic sensor 1 according to the present example embodiment.

In the present example embodiment, each of the plurality of protruding surfaces 305c of the insulating layer 305 has a triangular roof-like overall shape formed by moving the triangular shape of the protruding surface 305c shown in FIG. 12 in the direction parallel to the U direction. All the plurality of first inclined surfaces 305a and the plurality of second inclined surfaces 305b of the insulating layer 305 are flat surfaces. Each of the plurality of first inclined surfaces 305a is a flat surface parallel to the U direction and the W1 direction. Each of the plurality of second inclined surfaces 305b is a flat surface parallel to the U direction and the W2 direction.

Like the example shown in FIG. 6, the insulating layer 305 may include a plurality of protrusions for forming the plurality of protruding surfaces 305c. Alternatively, the insulating layer 305 may include a plurality of slopes arranged in the direction parallel to the V direction. The plurality of slopes each include a first wall surface corresponding to a first inclined surface 305a and a second wall surface corresponding to a second inclined surface 305b. A protruding surface 305c is constituted by the first wall surface of one slope and the second wall surface of another slope adjoining on the −V direction side of the one slope.

In the example shown in FIG. 12, the plurality of slopes each have a bottom surface corresponding to the flat surface 305d. However, the plurality of slopes do not need to have a bottom surface each.

The configuration, operation, and effects of the present example embodiment are otherwise the same as those of the first example embodiment.

The technology is not limited to the foregoing example embodiments, and various modifications may be made thereto. For example, the shape of each of the first and second insulating portions 311 and 312 is not limited to the example shown in each example embodiment, and may be any shape as long as the requirements of the claims are met.

The magnetic sensor 1 may further include a third detection circuit configured to detect a component of the target magnetic field in a direction parallel to the XY plane, and generate at least one third detection signal having a correspondence with the component. In such a case, the processor 40 may be configured to generate a detection value corresponding to a component of the target magnetic field in the direction parallel to the U direction based on the at least one third detection signal. The third detection circuit may be integrated with the first and second detection circuits 20 and 30, or may be included in a chip separate from the first and second detection circuits 20 and 30.

As described above, the magnetic sensor according to one embodiment of the technology includes a substrate including a reference plane; a support member disposed on the substrate, the support member including at least one inclined surface inclined with respect to the reference plane; at least one magnetic detection element disposed on the at least one inclined surface; a first insulating portion of an insulating material disposed on a part of the at least one magnetic detection element; and a second insulating portion of an insulating material disposed on another part of the at least one magnetic detection element at a position forward of the first insulating portion in a direction along the at least one inclined surface, the direction being a direction away from the reference plane.

The magnetic sensor according to one embodiment of the technology may further include an upper electrode disposed on the at least one magnetic detection element, the first insulating portion, and the second insulating portion, the upper electrode being electrically connected to the at least one magnetic detection element. The magnetic sensor according to one embodiment of the technology may further include a lower electrode provided between the at least one magnetic detection element and the at least one inclined surface, the lower electrode being electrically connected to the at least one magnetic detection element.

In the magnetic sensor according to one embodiment of the technology, the at least one magnetic detection element may include a bottom surface facing the at least one inclined surface, a top surface on a side opposite to the bottom surface, and first and second side surfaces each connecting the bottom surface and the top surface. The first insulating portion may be disposed on at least the first side surface. The second insulating portion may be disposed on at least the second side surface. The first insulating portion may be further disposed on a part of the top surface of the at least one magnetic detection element. The second insulating portion may be further disposed on a part of the top surface of the at least one magnetic detection element. Alternatively, the second insulating portion may not be disposed on the top surface of the at least one magnetic detection element.

In the magnetic sensor according to one embodiment of the technology, the inclined surface may be a curved surface. Alternatively, the at least one inclined surface may be a flat surface.

In the magnetic sensor according to one embodiment of the technology, the at least one inclined surface may include a first inclined surface and a second inclined surface facing different directions. The at least one magnetic detection element may include a first magnetic detection element disposed on the first inclined surface and a second magnetic detection element disposed on the second inclined surface. The support member may include a projecting surface projecting in a direction away from the reference plane. The projecting surface may include the first inclined surface and the second inclined surface. The second insulating portion disposed on the first magnetic detection element and the second insulating portion disposed on the second magnetic detection element may be a single insulating portion.

In the magnetic sensor according to one embodiment of the technology, the at least one inclined surface may include a first inclined surface and a second inclined surface facing different directions. The at least one magnetic detection element may include a first magnetic detection element disposed on the first inclined surface and a second magnetic detection element disposed on the second inclined surface. The support member may include a first projecting surface and a second projecting surface each projecting in a direction away from the reference plane. The first projecting surface may include the first inclined surface. The second projecting surface may include the second inclined surface. The first insulating portion disposed on the first magnetic detection element and the first insulating portion disposed on the second magnetic detection element may be a single insulating portion.

In the magnetic sensor according to one embodiment of the technology, each of the first insulating portion and the second insulating portion may include a first insulating layer of an insulating material and a second insulating layer of an insulating material disposed on the first insulating layer. The at least one magnetic detection element may include a bottom surface facing the at least one inclined surface, a top surface on a side opposite to the bottom surface, and first and second side surfaces each connecting the bottom surface and the top surface. The first insulating layer may be in contact with the first side surface and the second side surface.

Obviously, various modification examples and variations of the technology are possible in the light of the above teachings. Thus, it is to be understood that, within the scope of the appended claims and equivalents thereof, the technology may be practiced in other embodiments than the foregoing example embodiments.

What is claimed is:

1. A magnetic sensor comprising:
a substrate including a reference plane;
a support member disposed on the substrate, the support member including at least one inclined surface inclined with respect to the reference plane;
at least one magnetic detection element disposed on the at least one inclined surface; and
an insulating portion of an insulating material disposed on a part of the at least one magnetic detection element.

2. The magnetic sensor according to claim 1, wherein:
the insulating portion includes a first portion that is present on a part of the at least one magnetic detection element and a second portion that is not present on the part of the at least one magnetic detection element;
the first portion includes a protruding end located at an end of the insulating portion in a direction away from the reference plane; and
a thickness of the first portion becomes smaller toward a side opposite to the second portion from the protruding end.

3. The magnetic sensor according to claim 1, wherein:
the at least one magnetic detection element includes a bottom surface facing the at least one inclined surface, a top surface on a side opposite to the bottom surface, and first and second side surfaces each connecting the bottom surface and the top surface;
the second side surface is disposed forward of the first side surface in a direction along the at least one inclined surface, the direction being a direction away from the reference plane; and
the insulating portion is disposed on at least on the first side surface.

4. The magnetic sensor according to claim 3, wherein the insulating portion is further disposed on a part of the top surface of the at least one magnetic detection element.

5. The magnetic sensor according to claim 4, wherein:
the insulating portion includes a first portion that is present on a part of the at least one magnetic detection element and a second portion that is not present on the part of the at least one magnetic detection element;
the first portion includes a protruding end located at an end of the insulating portion in a direction away from the reference plane; and
a thickness of the first portion becomes smaller toward a side opposite to the second portion from the protruding end.

6. The magnetic sensor according to claim 3, wherein the support member includes a protruding surface including the at least one inclined surface.

7. The magnetic sensor according to claim 3, wherein the support member includes a slope including two wall surfaces facing each other, and at least one of the two wall surfaces corresponds to the at least one inclined surface.

8. The magnetic sensor according to claim 1, wherein:
the at least one magnetic detection element includes a bottom surface facing the at least one inclined surface, a top surface on a side opposite to the bottom surface, and first and second side surfaces each connecting the bottom surface and the top surface;
the second side surface is disposed forward of the first side surface in a direction along the at least one inclined surface, the direction being a direction away from the reference plane; and
the insulating portion is disposed on at least on the second side surface.

9. The magnetic sensor according to claim 8, wherein the insulating portion is further disposed on a part of the top surface of the at least one magnetic detection element.

10. The magnetic sensor according to claim 9, wherein:
the insulating portion includes a first portion that is present on a part of the at least one magnetic detection element and a second portion that is not present on the part of the at least one magnetic detection element;
the first portion includes a protruding end located at an end of the insulating portion in a direction away from the reference plane; and
a thickness of the first portion becomes smaller toward a side opposite to the second portion from the protruding end.

11. The magnetic sensor according to claim 8, wherein the insulating portion is not disposed on the top surface of the at least one magnetic detection element.

12. The magnetic sensor according to claim 1, further comprising an upper electrode disposed on the at least one magnetic detection element and the insulating portion, the upper electrode being electrically connected to the at least one magnetic detection element.

13. The magnetic sensor according to claim 1, further comprising a lower electrode provided between the at least one magnetic detection element and the at least one inclined surface, the lower electrode being electrically connected to the at least one magnetic detection element.

14. The magnetic sensor according to claim 1, wherein:
the at least one inclined surface includes a first inclined surface and a second inclined surface facing different directions;
the at least one magnetic detection element includes a first magnetic detection element disposed on the first inclined surface and a second magnetic detection element disposed on the second inclined surface;
the support member includes a projecting surface projecting in a direction away from the reference plane;
the projecting surface includes the first inclined surface and the second inclined surface; and
the insulating portion disposed on the first magnetic detection element and the insulating portion disposed on the second magnetic detection element are a single insulating portion.

15. The magnetic sensor according to claim 1, wherein:
the at least one inclined surface includes a first inclined surface and a second inclined surface facing different directions;
the at least one magnetic detection element includes a first magnetic detection element disposed on the first inclined surface and a second magnetic detection element disposed on the second inclined surface;
the support member includes a first projecting surface and a second projecting surface each projecting in a direction away from the reference plane;
the first projecting surface includes the first inclined surface;
the second projecting surface includes the second inclined surface; and the insulating portion disposed on the first magnetic detection element and the insulating portion disposed on the second magnetic detection element are a single insulating portion.

16. The magnetic sensor according to claim 1, wherein the insulating portion includes a first insulating layer of an insulating material and a second insulating layer of an insulating material disposed on the first insulating layer.

* * * * *